United States Patent
Lin et al.

(10) Patent No.: US 9,679,783 B2
(45) Date of Patent: Jun. 13, 2017

(54) MOLDING WAFER CHAMBER

(75) Inventors: Jing-Cheng Lin, Hsin-Chu (TW); Chin-Chuan Chang, Zhudong Township (TW); Jui-Pin Hung, Hsin-Chu (TW); Szu Wei Lu, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 614 days.

(21) Appl. No.: 13/208,197

(22) Filed: Aug. 11, 2011

(65) Prior Publication Data

US 2013/0037990 A1 Feb. 14, 2013

(51) Int. Cl.
| | |
|---|---|
| B29C 33/12 | (2006.01) |
| H01L 21/56 | (2006.01) |
| H01L 23/00 | (2006.01) |
| H01L 23/31 | (2006.01) |

(52) U.S. Cl.
CPC .......... *H01L 21/561* (2013.01); *B29C 33/123* (2013.01); *H01L 21/566* (2013.01); *H01L 24/96* (2013.01); *H01L 23/3121* (2013.01); *H01L 2924/181* (2013.01); *H01L 2924/3511* (2013.01)

(58) Field of Classification Search
CPC ...................................................... H01L 21/566
See application file for complete search history.

(56) References Cited

U.S. PATENT DOCUMENTS

| | | | | |
|---|---|---|---|---|
| 5,794,798 | A | * | 8/1998 | Kim .................. H01L 21/68707 108/157.18 |
| 5,824,569 | A | * | 10/1998 | Brooks ............... H01L 23/3107 257/E21.511 |
| 6,279,815 | B1 | | 8/2001 | Correia et al. |
| 6,344,162 | B1 | * | 2/2002 | Miyajima ................ 264/272.14 |
| 2002/0000547 | A1 | * | 1/2002 | Yamaguchi ....................... 257/4 |
| 2002/0140114 | A1 | * | 10/2002 | Matsumoto ................... 257/787 |
| 2004/0023609 | A1 | * | 2/2004 | Oshita ..................... B24B 37/32 451/397 |
| 2004/0101631 | A1 | * | 5/2004 | Uragami et al. ........... 427/430.1 |
| 2008/0072823 | A1 | * | 3/2008 | Yudovsky et al. ............ 118/728 |
| 2010/0213623 | A1 | * | 8/2010 | Isshiki et al. ................. 257/791 |
| 2012/0040500 | A1 | * | 2/2012 | Lin et al. ...................... 438/127 |

\* cited by examiner

*Primary Examiner* — Ryan Ochylski
(74) *Attorney, Agent, or Firm* — Slater Matsil, LLP

(57) ABSTRACT

A bottom chase and a top chase of a molding system form a cavity to house a molding carrier and one or more devices. The molding carrier is placed in a desired location defined by a guiding component. The guiding component may be entirely within the cavity, or extend above a surface of the bottom chase and extend over a contacting edge of the top chase and the bottom chase, so that there is a gap between the edge of the top chase and the edge of the molding carrier which are filled by molding materials to cover the edge of the molding carrier. Releasing components may be associated with the top chase and/or the bottom chase, which may be a plurality of tape roller with a releasing film, or a plurality of vacuum holes within the bottom chase, or a plurality of bottom pins with the bottom chase.

23 Claims, 6 Drawing Sheets

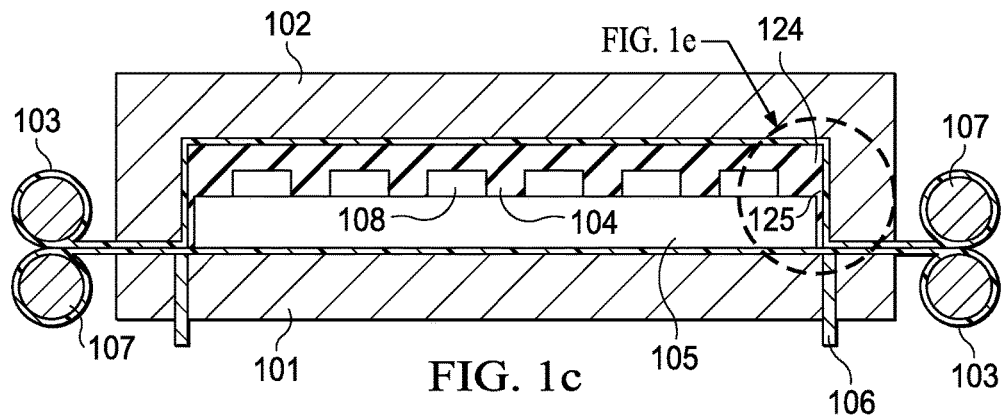
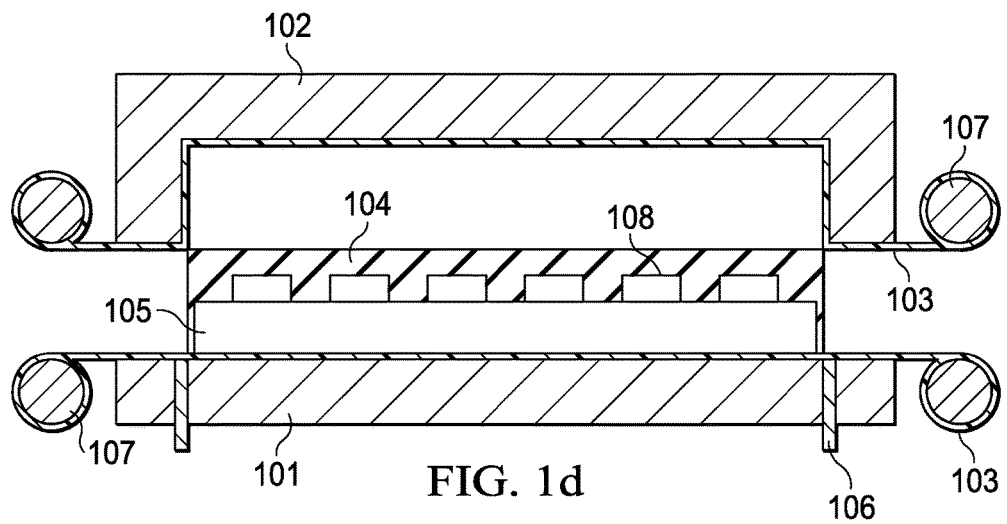
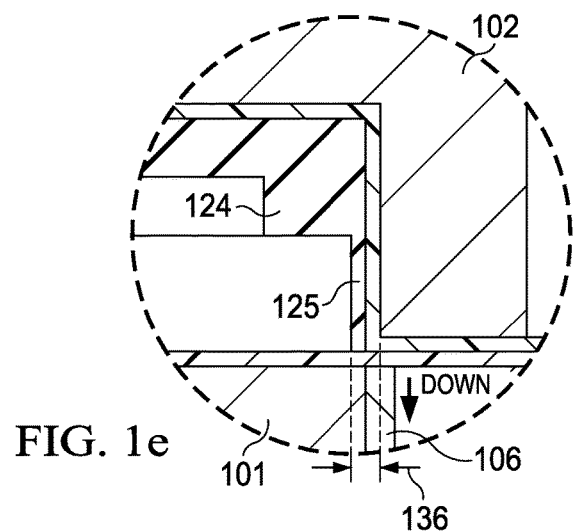

MOLDING WAFER CHAMBER

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

In an attempt to further increase circuit density, three-dimensional (3D) integrated circuits (ICs) have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Advances have also been made in wafer-level packaging. Generally, wafer-level packaging involves performing back-end-of-line processing at the wafer level as opposed to performing this processing after the wafer has been diced. In particular, wafer-level packaging may include forming contact structures, encapsulating or back-side protection, grinding, and the like at the wafer level. It has been found that performing these functions at the wafer level may decrease costs. Wafer-level packaging may also result in thinner packages.

After packaging, the wafer is separated into individual dice. Typically, however, wafer-level package techniques place a molding or encapsulant compound on its upper surface, leaving the edges of the wafer exposed. As a result, the wafer may be susceptible to damage and/or wafer warping.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1(a)-(e) illustrate various views of a molding process in accordance with an embodiment;

DETAILED DESCRIPTION OF ILLUSTRATIVE EMBODIMENTS

The making and forming of the present exemplary embodiments are discussed in detail below. It should be appreciated, however, that embodiments of the present disclosure provide many applicable concepts that can be embodied in a wide variety of specific contexts. The specific embodiments discussed are merely illustrative of specific ways to make and use the invention, and do not limit the scope of the invention.

The present disclosure describes embodiments with respect to a specific context, namely, a method and an apparatus for performing die-to-wafer level packaging. Other embodiments, however, may be used in other contexts, such as wafer-level packaging, die-to-die packaging, wafer-to-wafer packaging, and the like.

Generally, embodiments disclosed herein utilize a top and bottom chase to form a molding compound over a wafer. When brought together, a cavity is formed between the top and bottom chase, thereby at least in part defining a shape for the molding compound. One or more guide pins or guide rings may be used to assist in alignment of the top and bottom chases. In embodiments, the cavity and the guide pins (or ring) are positioned such that molding compound is formed alongside edges of the wafer, thereby protecting the wafer edges during subsequent processing.

Figure 1A:
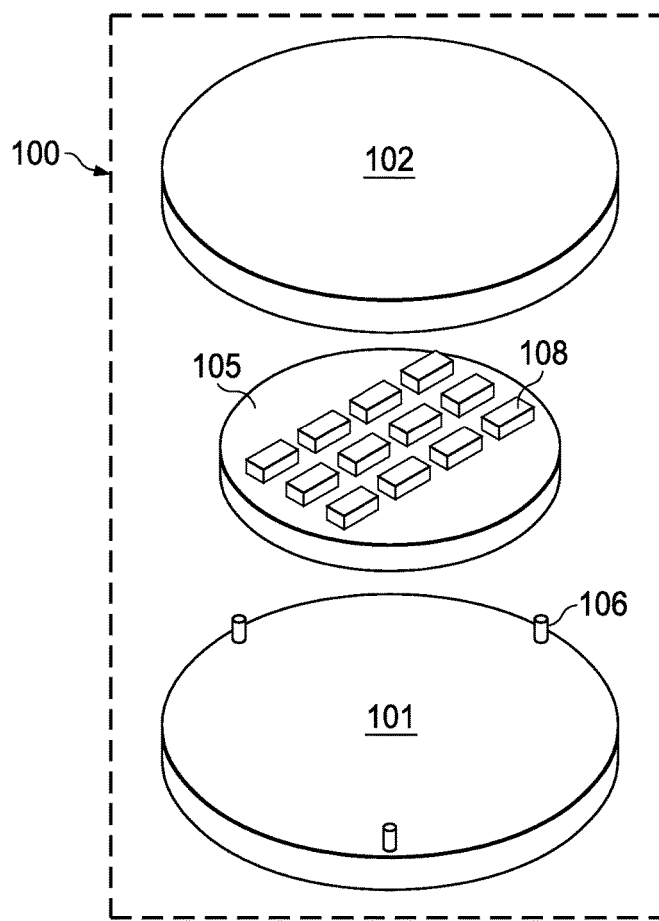

Referring now to FIGS. 1(a)-1(e), an embodiment of a molding process is shown. Referring first to FIG. 1(a), a molding apparatus 100 may comprise a bottom chase 101 and a top chase 102. When brought together, the top chase 102 and the bottom chase 101 form a cavity sized to accommodate a molding carrier 105 having a one or more devices 108, such as one or more dice, attached thereto. While the molding apparatus 100 may have a round shape, it should be understood that the round shape is provided for illustrative purposes only and that other embodiments may exhibit other shapes.

Figure 1B:
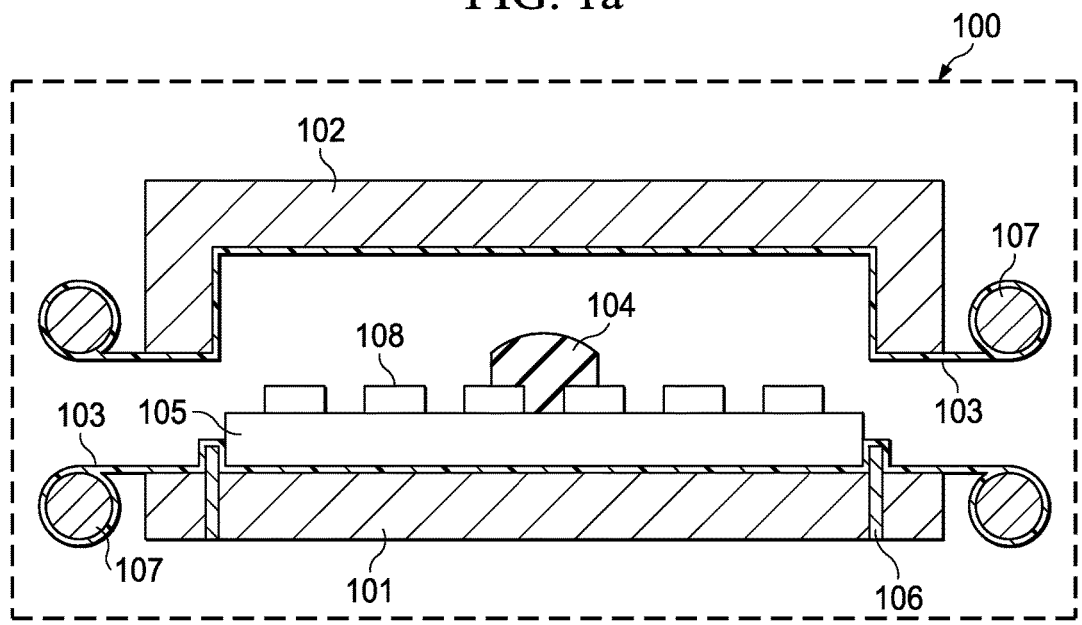

Referring to FIG. 1(b), which is a cross-sectional view of the molding apparatus 100 of FIG. 1(a), the bottom chase 101 may have a flat surface, and the top chase 102 may be of a U-shape, such that when brought together a cavity is formed between the top chase 102 and the bottom chase 101 sized appropriately to accommodate the molding carrier 105. The bottom chase 101 and top chase 102 may have different thickness from the ones shown. The bottom chase 101 and the top chase 102 shown in FIGS. 1(a) and (b) are only for illustrative purpose and not limiting.

Also shown in FIGS. 1(a) and (b), the bottom chase 101 comprises a guiding component, which illustratively is shown as a plurality of guide pins 106. The guide pins 106 may define the area where a molding carrier 105 may be placed during a molding process.

In an embodiment, there may be three or more guide pins 106. The guide pins 106 may extend above the surface of the bottom chase 101 as shown in FIG. 1(b). In this embodiment, it may be desirable to allow the guide pins 106 to be movable, such as in an up and down direction, such that the guide pins 106 may be retractable during the molding process. The three guide pins shown in FIG. 1(a) are only for illustrative purpose and not limiting, and as such, other number of guide pins may be used. The guide pins 106 may be of any suitable material, such as metals, plastic, Teflon, and/or the like. The height of the guide pins 106 may also vary. For example, the guide pins 106 may be lower than the upper surface of the molding carrier 105, or higher than the upper surface of the molding carrier 105.

The molding apparatus may further comprise a releasing component to aid in the removal of the molding carrier 105 after the molding process. In the embodiment illustrated in FIG. 1(*b*), the releasing component comprises a plurality of tape rollers 107 for supplying a release film 103 to the molding apparatus 100. In this embodiment, the release film 103 is applied to both the top chase 102 and the bottom chase 101, although in other embodiments the release film may be applied to one or the other of the top chase 102 and the bottom chase 101, such as being applied to only the bottom chase 101.

The release film 103 is arranged on top of the guide pins 106 and below the molding carrier 105, which will be placed into the molding apparatus during the molding process. The release film 103 may be arranged to contact the top chase 102 and bottom chase 101 very closely, by "sealing" peripheral portions of the releasing film 103 and increasing the pressure between the films. The releasing film 103 may make the release of the molding carrier 105 easier to remove after the molding process is completed.

The illustrative molding apparatus 100 may further comprise (not shown in FIGS. 1(*a*) and (*b*)) a mold moving control unit to move the bottom chase 101 upward, the top chase 102 downward, or both, and to move components of the bottom chase 101 and the top chase 102 such as the movement of the guide pins 106 or other components. In addition, the illustrative molding apparatus 100 may comprise a temperature control unit (not shown in the figures), for controlling the temperature of the bottom chase 101, the top chase 102, and/or the cavity between the top chase 102 and the bottom chase 101. The temperature control unit may comprise a temperature controller for controlling the temperature, and a heat pipe or power supply controlled by the temperature controller for heating the chamber as necessary.

As shown in FIG. 1(*b*), the molding carrier 105 may be placed on the area defined by the guide pins 106 so that the placement of the molding carrier 105 is at the desired location within the molding apparatus 100. The molding carrier 105 may be a wafer or other kind of carrier such as an interposer or a printed circuit board. The guide pins 106 may reach out of the surface of the bottom chase 101. The molding carrier 105 is so placed that the molding carrier 105 is on top of the release film 103 and edges of the molding carrier 105 next to the guide pins 106, so that there is a small gap or no gap between the edges of molding carrier 105 and the guide pins 106 except the release film 103 therebetween.

Furthermore, as shown in FIG. 1(*b*), silicon devices such as a plurality of semiconductor devices 108 are positioned on the molding carrier 105. The devices 108 may be chips, or other kinds of devices. The pattern formed by the devices 108 is only for illustrative purpose. There may be other numbers of devices 108 located in different positions from the one shown in FIG. 1(*b*). Furthermore, the plurality of devices 108 may be connected to a plurality of conductive bumps on its upper surface (not shown). The plurality of devices may have a plurality of input/output pads (not shown).

As shown in FIG. 1(*b*), a molding material or an encapsulant 104 is placed on top of the molding carrier 105 and/or devices 108. Thereafter, the bottom chase 101 and the top chase 102 are brought together, spreading the molding material 104 to cover the plurality of devices 108 and fill into the space between the plurality of devices 108, thereby forming a molding layer 124 as shown in FIG. 1(*c*). The molding material 104 may be a solid encapsulant, such as Epoxy Molding Compound (EMC), polyimide, epoxy, silicon, and/or the like. The bottom chase 101 and/or the top chase 102 may be heated in order to cure the molding material 104.

FIG. 1(*c*) illustrates an embodiment in which the guide pins 106 are retractable. In this embodiment, the guide pins 106 may extend over a contacting edge between the top chase 102 and the bottom chase 101, as shown in FIG. 1(*e*). In this manner, the guide pins 106 are retracted as the top chase 102 and the bottom chase 101 are brought together. Because the guide pins 106 extend further than the contacting edge between the top chase 102 and the bottom chase 101, edges of the molding carrier 105 are exposed as indicated by reference numeral 136. This gap will be filled with molding materials in the molding process to protect the edge of the molding carrier 105.

Still referring to FIG. 1(*c*), the top chase 102 and the bottom chase 101 together with the cavity formed in between are typically heated so that the molding material 104 will be thermally compressed onto the upper surface of the molding carrier 105. The heating and pressure within the molding system 100 may be sufficient to cure the molding material 104. Once bonded to the surfaces of the molding carrier 105, the molding material 104 becomes the molding layer 124 as shown in FIG. 1(*c*). In an embodiment, the bonding process is controlled by mechanical and/or optical process, or controlled by a control unit to control the magnitude and time of force applied. The molding layer 124 covers the surfaces of the devices 108, the top surface of the molding carrier 105, and the side molding edges 125 of the molding carrier 105 (enlarged and shown in FIG. 1(*e*)), which are within the cavity formed by the top chase 102 and the bottom chase 101. Since the edges of the molding carrier 105 are covered by the molding layer 124, the edges of the molding carrier 105 are protected which can prevent edge chipping of the molding carrier 105.

Next, as illustrated in FIG. 1(*d*), once the molding layer 124 is sufficiently bonded to the surfaces of the molding carrier 105, the top chase 102 and the bottom chase 101 may be separated and the encapsulated molding carrier 105 removed with the aid of the release film 103 and releasing tape roller 107.

Referring now to FIGS. 2(*a*)-2(*e*), another embodiment of a molding process is shown. Referring first to FIG. 2(*a*), a molding apparatus 200 may comprise a bottom chase 201 and a top chase 202. When brought together, the top chase 202 and the bottom chase 201 form a cavity sized to accommodate a molding carrier 105 having a one or more devices 108, such as one or more dice, attached thereto. While the molding apparatus may have a round shape, it should be understood that the round shape is provided for illustrative purposes only and that other embodiments may exhibit other shapes.

Referring to FIG. 2(*b*), which is a cross-sectional view of the molding apparatus 200 of FIG. 2(*a*), the bottom chase 201 may be of a U-shape, and the top chase 202 may have a flat surface, such that when brought together a cavity is formed between the top chase 202 and the bottom chase 201 sized appropriately to accommodate the molding carrier 105. The bottom chase 201 and top chase 202 may have different thickness from the ones shown. The bottom chase 201 and the top chase 202 shown in FIGS. 2(*a*) and (*b*) are only for illustrative purpose and not limiting.

Also shown in FIGS. 2(*a*) and (*b*), the bottom chase 201 comprises a guiding component, which illustratively is shown as a plurality of guide pins 106. The guide pins 106 may define the area where a molding carrier 105 may be placed during a molding process.

Figure 2A:
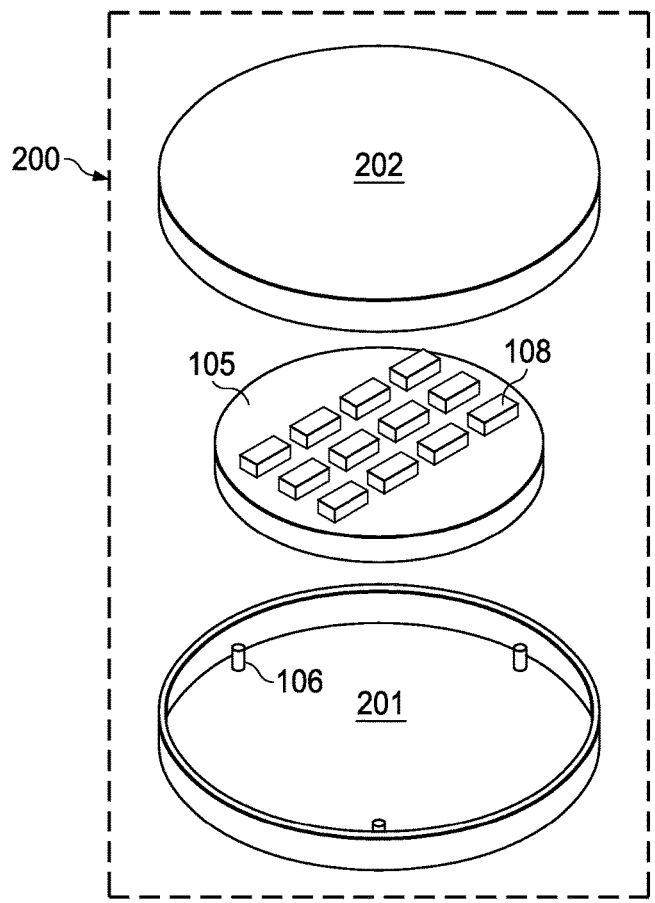
FIGS. 2(a)-(e) illustrate various views of a molding process in accordance with another embodiment.
Figure 2B:
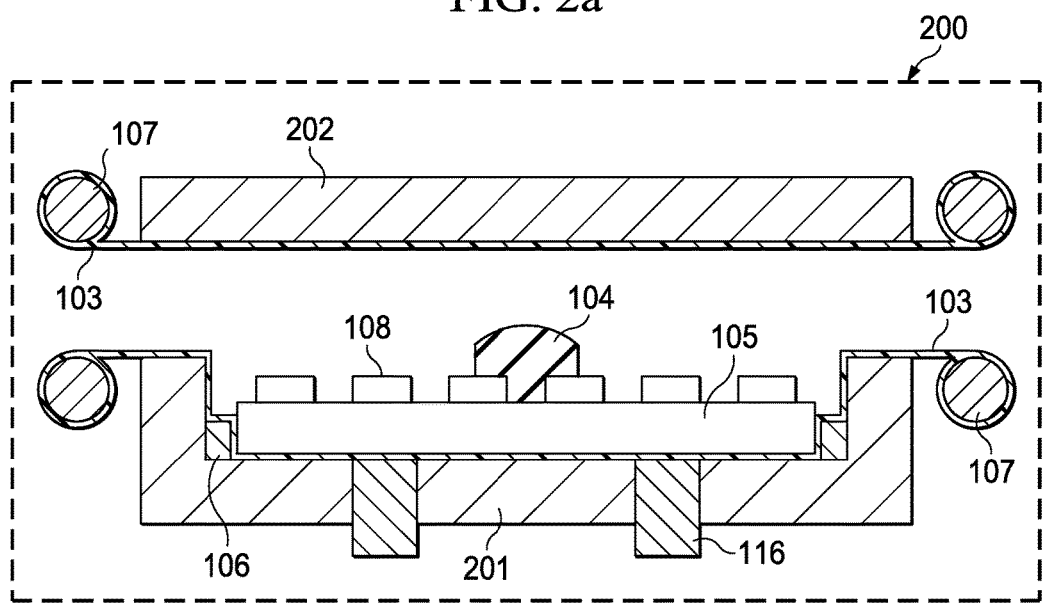

In an embodiment, there may be three or more guide pins 106. The guide pins 106 may extend above the surface of the bottom chase 201 as shown in FIG. 2(b). In this embodiment, it may be desirable to allow the guide pins 106 to be in a fixed position. The three guide pins shown in FIG. 2(a) are only for illustrative purpose and not limiting, and as such, other number of guide pins may be used. The guide pins 106 may be of any suitable material, such as metals, plastic, Teflon, and/or the like. The height of the guide pins 106 may also vary. For example, the guide pins 106 may be lower than the upper surface of the molding carrier 105, or higher than the upper surface of the molding carrier 105.

The molding apparatus 200 may further comprise a releasing component to aid in the removal of the molding carrier 105 after the molding process. In the embodiment illustrated in FIG. 2(b), the releasing component comprises a plurality of tape rollers 107 for supplying a release film 103 to the molding apparatus 200. In this embodiment, the release film 103 is applied to both the top chase 202 and the bottom chase 201, although in other embodiments the release film may be applied to one or the other of the top chase 202 and the bottom chase 201, such as being applied to only the bottom chase 201.

The release film 103 is arranged on top of the guide pins 106 and below the molding carrier 105, which will be placed into the molding apparatus during the molding process. The release film 103 may be arranged to contact the top chase 202 and bottom chase 201 very closely, by "sealing" peripheral portions of the releasing film 103 and increasing the pressure between the films. The releasing film 103 may make the release of the molding carrier 105 easier to remove after the molding process is completed.

Still referring to FIG. 2(b), the releasing component of the illustrative molding apparatus 200 may further comprise one or more bottom pins 116 within the bottom chase 201. The number, the size, and the position of bottom pins 116, shown in FIG. 2(b) are only for illustrative purposes and not limiting. There may be more than two bottom pins 116 within the bottom chase 201, with different sizes and locations. The bottom pins 116 may be movable, such as in an up and down direction, such the bottom pins 116 may be retractable during the molding process, move up and down. In its initial position, the bottom pins 116 may be of the same level as the surface of the bottom chase 201 so that the molding carrier 105 lies on a flat surface of the bottom chase 201 when so placed. When the compression molding is completed, the bottom pins 116 may be pushed upward to release the molding carrier 105 and the devices 108.

The illustrative molding apparatus 200 may further comprise (not shown in FIGS. 2(a) and (b)) a mold moving control unit to move the bottom chase 201 upward, the top chase 202 downward, or both, and to move components of the bottom chase 201 and the top chase 202 such as the movement of the guide pins 106, the movement of the bottom pins 116, or other components. In addition, the illustrative molding apparatus 200 may comprise a temperature control unit (not shown in the figures), for controlling the temperature of the bottom chase 201, the top chase 202, and/or the cavity between the top chase 202 and the bottom chase 201. The temperature control unit may comprise a temperature controller for controlling the temperature, and a heat pipe or power supply controlled by the temperature controller for heating the chamber as necessary.

As shown in FIG. 2(b), the molding carrier 105 may be placed on the area defined by the guide pins 106 so that the placement of the molding carrier 105 is at the desired location within the molding apparatus 200. The molding carrier 105 may be a wafer or other kind of carrier such as an interposer or a printed circuit board. The molding carrier 105 is placed so that the molding carrier 105 is on top of the release film 103 and edges of the molding carrier 105 next to the guide pins 106, so that there is a small gap or no gap between the edges of molding carrier 105 and the guide pins 106 except the release film 103 there between.

Furthermore, as shown in FIG. 2(b), silicon devices such as a plurality of semiconductor devices 108 are positioned on the molding carrier 105. The devices 108 may be chips, or other kinds of devices. The pattern formed by the devices 108 is only for illustrative purpose. There may be other numbers of devices 108 located in different positions from the one shown in FIG. 2(b). Furthermore, the plurality of devices 108 may be connected to a plurality of conductive bumps on its upper surface (not shown). The plurality of devices may have a plurality of input/output pads (not shown).

Figure 2C:
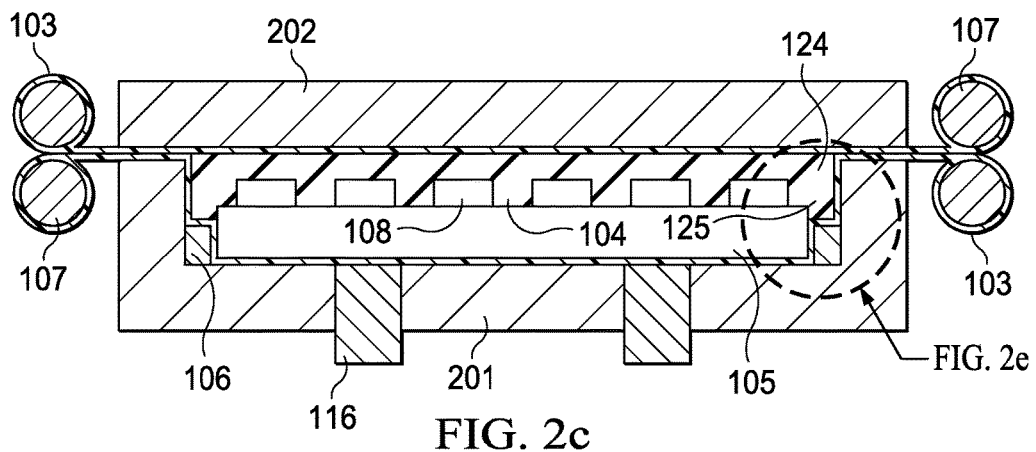

As shown in FIG. 2(b), a molding material or an encapsulant 104 is placed on top of the molding carrier 105 and/or devices 108. Thereafter, the bottom chase 201 and the top chase 202 are brought together, spreading the molding material 104 to cover the plurality of devices 108 and fill into the space between the plurality of devices 108, thereby forming a molding layer 124 as shown in FIG. 2(c). The molding material 104 may be a solid encapsulant, such as Epoxy Molding Compound (EMC), polyimide, epoxy, silicon, and/or the like. The bottom chase 201 and/or the top chase 202 may be heated in order to cure the molding material 104.

FIG. 2(c) illustrates an embodiment in which the guide pins 106 are in fixed positions, which may be entirely encompassed within the cavity formed by the top chase 202 and the bottom chase 201, as shown in FIG. 2(c). The height of the guide pins 106 may be lower than the top surface of the molding carrier 105 so that some portion of the top edge of the molding carrier 105 is exposed which may be covered by molding materials 104 in the molding process to protect the edge of the molding carrier 105.

Still referring to FIG. 2(c), the top chase 202 and the bottom chase 201 together with the cavity formed in between are typically heated so that the molding material 104 will be thermally compressed onto the upper surface of the molding carrier 105. The heating and pressure within the molding system 200 may be sufficient to cure the molding material 104. Once bonded to the surfaces of the molding carrier 105, the molding material 104 becomes the molding layer 124 as shown in FIG. 2(c). In an embodiment, the bonding process is controlled by mechanical and/or optical process, or controlled by a control unit to control the magnitude and time of force applied. The molding layer 124 covers the surfaces of the devices 108, the top surface of the molding carrier 105, and the side molding edges 125 of the molding carrier 105 (enlarged and shown in FIG. 2(e)), which are within the cavity formed by the top chase 202 and the bottom chase 201. Since the edges of the molding carrier 105 are covered by the molding layer 124, the edges of the molding carrier 105 are protected which can prevent edge chipping of the molding carrier 105.

Figure 2D:
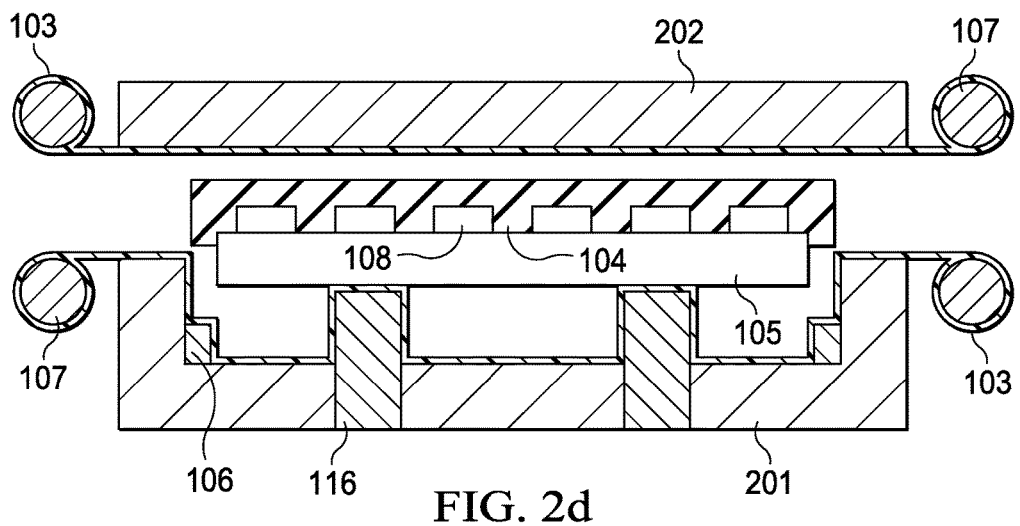
Figure 2E:
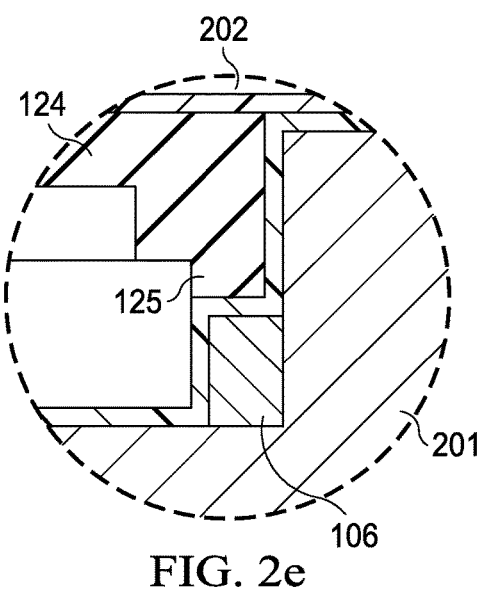

Next, as illustrated in FIG. 2(d), once the molding layer 124 is sufficiently bonded to the surfaces of the molding carrier 105, the top chase 202 and the bottom chase 201 may be separated and the encapsulated molding carrier 105 removed with the aid of the release film 103 and releasing tape roller 107, further aided by moving the bottom pins 116 upwards as shown in FIG. 2(d).

Figure 3A:
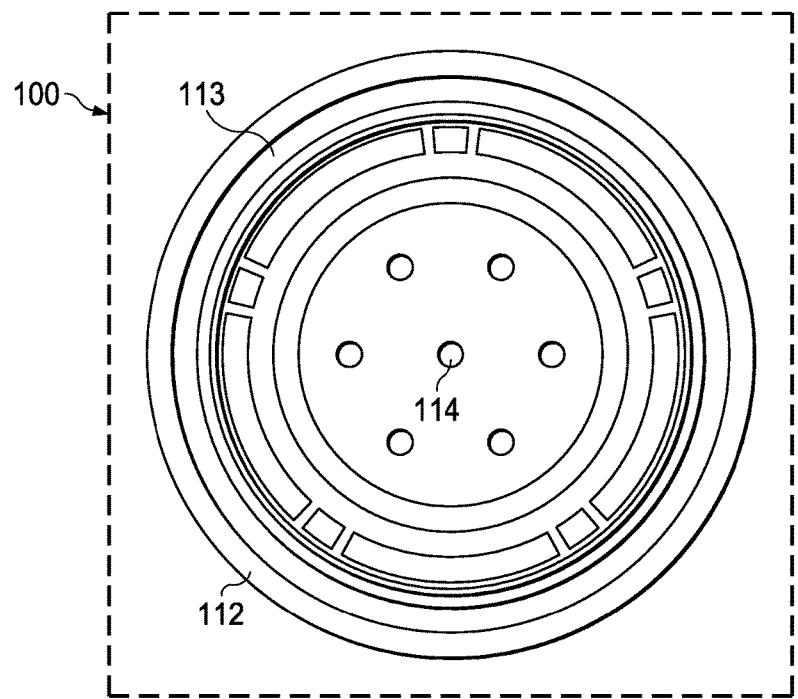
FIGS. 3(a)-(e) illustrate various views of a molding process in accordance with yet another embodiment.

Referring now to FIGS. 3(a)-3(e), yet another embodiment of a molding process is shown. Referring first to FIG. 3(a), a molding apparatus 300 may comprise a bottom chase 301 and a top chase 302. When brought together, the top chase 302 and the bottom chase 301 form a cavity sized to accommodate molding carrier 105 having a one or more devices 108, such as one or more dice, attached thereto. While the molding apparatus 300 may have a round shape, it should be understood that the round shape is provided for illustrative purposes only and that other embodiments may exhibit other shapes.

Figure 3B:
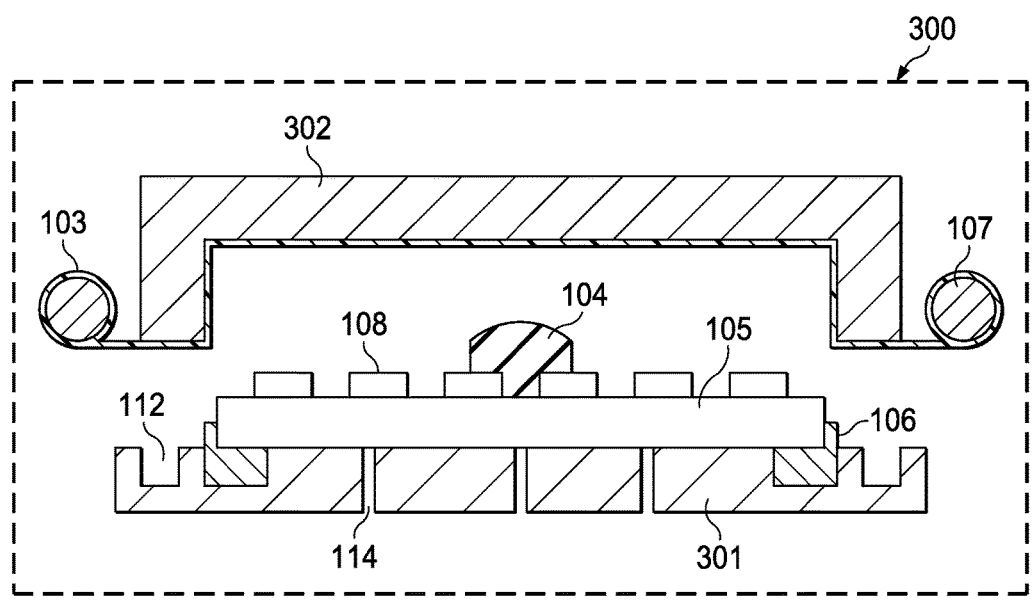

Referring to FIG. 3(b), which is a cross-sectional view of the molding apparatus 300 of FIG. 3(a), the bottom chase 301 may have a flat surface, and the top chase 302 may be of a U-shape, such that when brought together a cavity is formed between the top chase 302 and the bottom chase 301 sized appropriately to accommodate the molding carrier 105. The bottom chase 301 and top chase 302 may have different thickness from the ones shown. The bottom chase 301 and the top chase 302 shown in FIGS. 3(a) and (b) are only for illustrative purpose and not limiting.

Also shown in FIGS. 3(a) and (b), the bottom chase 301 comprises a guiding component, which illustratively is shown as a guide ring 106. The guide ring 106 may define the area where a molding carrier 105 may be placed during a molding process. The guide ring 106 shown in FIG. 3(b) may be made of Teflon and it is further extended into the body of the bottom chase 301 to form an L shape surrounding the molding carrier 105. The guide ring 106 may be made of other materials too such as metal or plastic. The guide ring 106 is of a fixed position that does not move up or down. The height of the guide ring 106 may vary. For example, the guide ring 106 may be lower than the upper surface of the molding carrier 105, or higher than the upper surface of the molding carrier 105. The guide ring 106 is entirely within the cavity formed by the top chase 302 and the bottom chase 301 when brought together.

The molding apparatus 300 may further comprise a releasing component to aid in the removal of the molding carrier 105 after the molding process. In the embodiment illustrated in FIG. 3(b), the releasing component comprises a plurality of tape rollers 107 attached to the top chase 302 for supplying a release film 103 to the molding apparatus 300. The release film 103 is arranged to contact the top chase 302 very closely, by "sealing" peripheral portions of the releasing film 103 and increasing the pressure within the cavity formed by the top chase 302 and the bottom chase 301. The releasing film 103 may make the release of the molding carrier 105 easier to remove after the molding process is completed.

FIG. 3(b) also illustrates one or more vacuum holes 114, which acts as a releasing component for the bottom chase 301. The position, number, and the size of the vacuum holes 114 shown in FIG. 3(b) are only for illustrative purpose and not limiting. The vacuum holes 114 can make the molding carrier 105 fixed to the bottom chase 301 during the molding process, or release the molding carrier 105 after the molding is completed.

Further as shown in FIG. 3 (b), a trench 112 circles around the bottom chase 301. The position, size, and width of the trench 112 are only shown for illustrative purpose, and not limiting. The trench 112 is for collecting the molding compound residue if there is any overflow in the molding process.

The illustrative molding apparatus 300 may further comprise (not shown in FIGS. 3(a) and (b)) a mold control unit to move the bottom chase 301 upward, the top chase 302 downward, or both, and to operate components of the bottom chase 301 and the top chase 302 such as the operation of the vacuum holes 114 or other components. In addition, the illustrative molding apparatus 300 may comprise a temperature control unit (not shown in the figures), for controlling the temperature of the bottom chase 301, the top chase 302, and/or the cavity between the top chase 302 and the bottom chase 301. The temperature control unit may comprise a temperature controller for controlling the temperature, and a heat pipe or power supply controlled by the temperature controller for heating the chamber as necessary.

As shown in FIG. 3(b), the molding carrier 105 may be placed on the area defined by the guide ring 106 so that the placement of the molding carrier 105 is at the desired location within the molding apparatus 100. The molding carrier 105 may be a wafer or other kind of carrier such as an interposer or a printed circuit board. The guide ring 106 may be in its initial position that reaches out of the surface of the bottom chase 301, yet the guide ring 106 is lower than the height of the molding carrier 105. The molding carrier 105 is so placed that the molding carrier 105 is on top of the flat part of the L-shaped guide ring 106 and next to the vertical part of the L-shaped guide ring 106, and edges of the molding carrier 105 next to the guide ring 106, so that there is a small gap or no gap between the edges of molding carrier 105 and the guide ring 106. The guide ring 106 is entirely within the cavity formed by the top chase 302 and the bottom chase 301 once brought together.

Furthermore, as shown in FIG. 3(b), silicon devices such as a plurality of semiconductor devices 108 are positioned on the molding carrier 105. The devices 108 may be chips, or other kinds of devices. The pattern formed by the devices 108 is only for illustrative purpose. There may be other numbers of devices 108 located in different positions from the one shown in FIG. 3(b). Furthermore, the plurality of devices 108 may be connected to a plurality of conductive bumps on its upper surface (not shown). The plurality of devices may have a plurality of input/output pads (not shown).

Figure 3C:
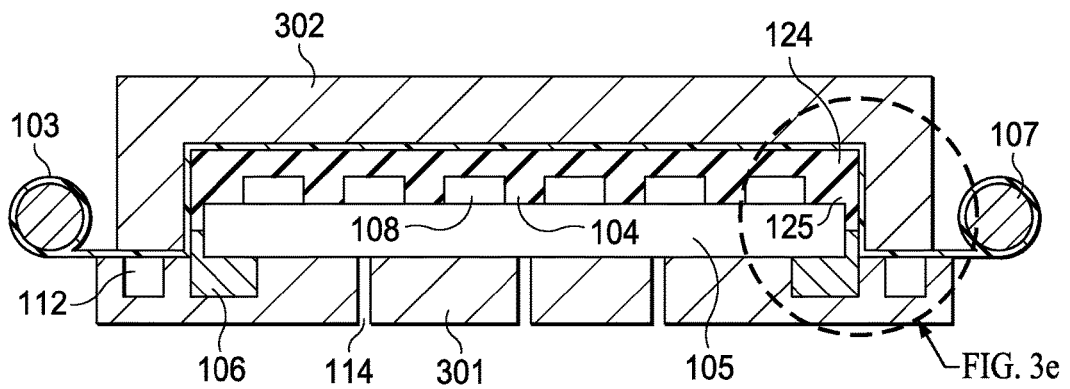

As shown in FIG. 3(b), a molding material or an encapsulant 104 is placed on top of the carrier 105 and/or devices 108. Thereafter, the bottom chase 101 and the top chase 102 are brought together, spreading the molding material 104 to cover the plurality of devices 108 and fill the space between the plurality of devices 108, thereby forming a molding layer 124 as shown in FIG. 3(c). The molding material 104 may be a solid encapsulant, such as Epoxy Molding Compound (EMC), polyimide, epoxy, silicon, and/or the like. The bottom chase 301 and/or the top chase 302 may be heated in order to cure the molding material 104.

FIG. 3(c) illustrates an embodiment in which the guide ring 106 is in a fixed position. In this embodiment, the guide ring 106 may be completely encompassed by the cavity formed by the top chase 302 and the bottom chase 301, as shown in FIG. 3(e), so that there is a gap between the molding carrier 105 which is placed next to the guide ring 106, and the edge of the top chase 302, which exposes the edges of the molding carrier 105. The gap will be filled with molding materials in the molding process to protect the edge of the molding carrier 105.

Still referring to FIG. 3(c), the top chase 302 and the bottom chase 301 together with the cavity formed in between are typically heated so that the molding material 104 will be thermally compressed onto the upper surface of the molding carrier 105. The heating and pressure within the molding system 300 may be sufficient to cure the molding material 104. Once bonded to the surfaces of the molding carrier 105, the molding material 104 becomes the molding layer 124 as shown in FIG. 3(c). In an embodiment, the bonding process is controlled by mechanical and/or optical process, or controlled by a control unit to control the magnitude and time of force applied. The molding layer 124 covers the surfaces of the devices 108, the top surface of the carrier 105, and the side molding edges 125 of the molding carrier 105 (enlarged and shown in FIG. 3(e)), which are within the cavity formed by the top chase 302 and the bottom chase 301. Since the edges of the molding carrier 105 are covered by the molding layer 125, the edges of the molding carrier 105 are protected which can prevent edge chipping of the carrier 105.

Figure 3D:
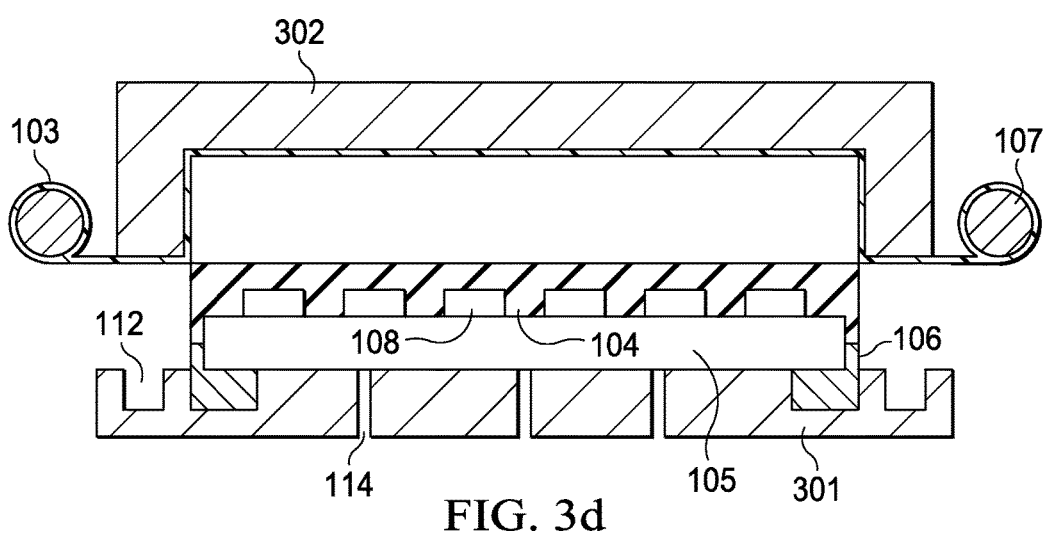
Figure 3E:
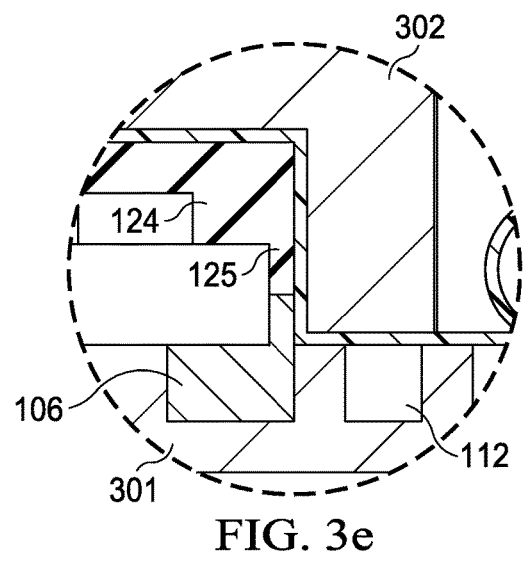

Next, as illustrated in FIG. 3(d), once the molding layer 124 is sufficiently bonded to the surfaces of the carrier 105, the top chase 302 and the bottom chase 301 may be separated and the encapsulated molding carrier 105 removed with the aid of the release film 103 and releasing tape roller 107, in addition to the use of vacuum holes 114 within the bottom chase 301.

While the disclosure has been particularly shown and described with reference to exemplary embodiments thereof, it will be understood by those skilled in the art that various changes in form and details may be made therein without departing from the spirit and scope of the invention as defined by the appended claims.

What is claimed is:

1. A molding system comprising:
   a bottom chase with a first shape;
   a guiding component mounted in the bottom chase, the guiding component having an outer sidewall and a top surface, the guiding component adapted to hold a molding carrier having a first height in a predetermined location, wherein the guiding component extends above a surface of the bottom chase, the guiding component having a second height smaller than the first height, wherein the second height is measured from the surface of the bottom chase to a surface of the guiding component facing away from the bottom chase, wherein the guiding component is a metal; and
   a top component with a second shape, wherein the first shape and the second shape together form a cavity, the cavity having an outer sidewall coterminous with the outer sidewall of the guiding component, wherein the top surface of the guiding component is exposed to the cavity.

2. The molding system of claim 1, wherein the guiding component is in a fixed position that is within the cavity formed by the top component and the bottom chase.

3. The molding system of claim 1, wherein the guiding component comprises a guide ring within the bottom chase.

4. The molding system of claim 1, wherein the guiding component comprises a plurality of guide pins that are movable up and down.

5. The molding system of claim 1, further comprising a trench within the bottom chase placed outside the guiding component.

6. The molding system of claim 1, wherein the top component comprises a top chase and a releasing film, wherein the molding system further comprises a releasing component comprising a plurality of tape rollers adjacent to the top chase, the releasing film wound around at least one of the plurality of tape rollers.

7. The molding system of claim 1, further comprising a releasing component comprising one or more bottom pins within the bottom chase that are movable up and down.

8. The molding system of claim 1, further comprising a releasing component comprising one or more vacuum holes within the bottom chase.

9. A molding system comprising:
   a molding carrier having a first height;
   a plurality of semiconductor devices on the molding carrier;
   a mold having a bottom component, a top component, and a cavity between the bottom component and the top component;
   one or more metal guides disposed within the cavity and located away from sidewalls of the cavity, the one or more metal guides adapted to position the molding carrier within the cavity, wherein the one or more metal guides are adapted to have a second height smaller than the first height; and
   an encapsulant on the molding carrier, the encapsulant covering each of the plurality of semiconductor devices, the encapsulant contacting a portion of a sidewall of the molding carrier, the one or more metal guides contacting remaining portions of the sidewall of the molding carrier.

10. The molding system of claim 9, wherein the one or more metal guides are positioned to overlap the sidewalls of the cavity such that when the top component and the bottom component are joined, the one or more metal guides are retracted.

11. The molding system of claim 9, wherein the one or more metal guides comprise a guide ring.

12. The molding system of claim 9, further comprising one or more release pins in the bottom component, the one or more release pins configured to extend, thereby raising the molding carrier.

13. The molding system of claim 9, wherein the metal guides comprise fixed pins extending into the cavity.

14. The molding system of claim 9, further comprising one or more vacuum ports in the bottom component.

15. The molding system of claim 9, wherein the one or more metal guides are in a fixed position that is within the cavity formed by the top component and the bottom component.

16. The molding system of claim 9, further comprising a trench within the bottom component placed outside the one or more metal guides.

17. The molding system of claim 9, further comprising a releasing component comprising a plurality of tape rollers adjacent to the top component and a releasing film wound around at least one of the plurality of tape rollers.

18. A molding system comprising:
   a bottom component with a first shape;
   a top component with a second shape, wherein the first shape and the second shape are configured to form a cavity; and
   a metal guiding component mounted in the bottom component, wherein the metal guiding component extends above a surface of the bottom component and has a top surface facing away from the surface of the bottom component, wherein the metal guiding component has an outer sidewall, wherein the metal guiding component is adapted to hold, in a predetermined position of the bottom component, a molding carrier having a top surface separated from the bottom component by a first distance, and wherein the top surface of the metal guiding component is separated from the bottom component by a second distance smaller than the first distance, wherein the cavity has an outer sidewall aligned with the outer sidewall of the metal guiding component and a bottom portion aligned with the top surface of the metal guiding component; and a first releasing component comprising one or more bottom pins within the bottom component, the first releasing component adapted to move the molding carrier toward the top component.

19. The molding system of claim 18, wherein the first shape is different from the second shape.

20. The molding system of claim 18, wherein the metal guiding component is in a fixed position that is within the cavity formed by the top component and the bottom component.

21. The molding system of claim 18, wherein the metal guiding component comprises a guide ring within the bottom component.

22. The molding system of claim 18, further comprising a trench within the bottom component placed outside the metal guiding component.

23. The molding system of claim 18, further comprising a second releasing component comprising a plurality of tape rollers adjacent to the top component and a releasing film wound around at least one of the plurality of tape rollers.

* * * * *